United States Patent [19]
Costello et al.

[11] Patent Number: 5,814,880
[45] Date of Patent: Sep. 29, 1998

[54] THICK FILM COPPER METALLIZATION FOR MICROWAVE POWER TRANSISTOR PACKAGES

[75] Inventors: John A. Costello, Annapolis, Md.; Harry Buhay, Allison Park, Pa.; Richard R. Papania, Pittsburgh, Pa.; Prosenjit Rai-Choudhury, Export, Pa.; Kenneth J. Petrosky, Severna Park, Md.; Gene A. Madia, Plum Borough, Pa.

[73] Assignee: Northrop Grumman Corporation, Los Angeles, Calif.

[21] Appl. No.: 11,094

[22] Filed: Jan. 29, 1993

Related U.S. Application Data

[63] Continuation of Ser. No. 793,233, Nov. 8, 1991, abandoned, which is a continuation of Ser. No. 453,287, Dec. 22, 1989, abandoned.

[51] Int. Cl.⁶ .................................................. H01L 23/14
[52] U.S. Cl. .......................... 257/678; 257/684; 257/700; 257/701; 257/702; 257/690; 257/688; 257/712
[58] Field of Search ................................... 357/74, 81, 67, 357/71; 351/80, 81; 257/787, 678, 684, 700, 701, 702, 690, 688, 712

[56] References Cited

U.S. PATENT DOCUMENTS

| | | | |
|---|---|---|---|
| 3,626,259 | 12/1971 | Garboushian | 357/71 |
| 3,814,633 | 6/1974 | Freedman et al. | 357/71 |
| 4,482,912 | 11/1984 | Chiba et al. | 357/67 |
| 4,556,899 | 12/1985 | Kurihara et al. | 357/71 |
| 4,639,760 | 1/1987 | Granberg et al. | 357/75 |
| 4,649,416 | 3/1987 | Borkowski et al. | 357/75 |
| 4,825,284 | 4/1989 | Soga et al. | 357/81 |
| 4,835,593 | 5/1989 | Arnold et al. | 357/80 |
| 4,947,238 | 8/1990 | Ishii et al. | 357/80 |
| 5,001,546 | 3/1991 | Butt | 357/71 |

FOREIGN PATENT DOCUMENTS

| | | |
|---|---|---|
| 3221199 | 1/1983 | Germany . |
| 55-30815 | 3/1980 | Japan . |
| 58-101412 | 6/1983 | Japan . |
| 59-175733 | 4/1984 | Japan . |
| 60-147146 | 8/1985 | Japan . |
| 63-240051 | 10/1988 | Japan . |
| 1-57683 | 3/1989 | Japan . |

OTHER PUBLICATIONS

"Film on metal leaded chip carrier", IBM TDB, vol. 31, No. 1, Jun. 1988, pp. 2–4.

Magdo, "semiconductor encapsulation", IBM TDB, vol. 20, No. 10, Mar. 1978, pp. 3903–3904.

*Primary Examiner*—Viet Q. Nguyen
*Attorney, Agent, or Firm*—Walter G. Sutcliff

[57] ABSTRACT

A heat dissipating module and package for power microwave transistors and method of making same that includes a substrate having a thick copper layer bonded to a ceramic core which is thereto subjected to high processing temperatures.

44 Claims, 6 Drawing Sheets

FIG.5
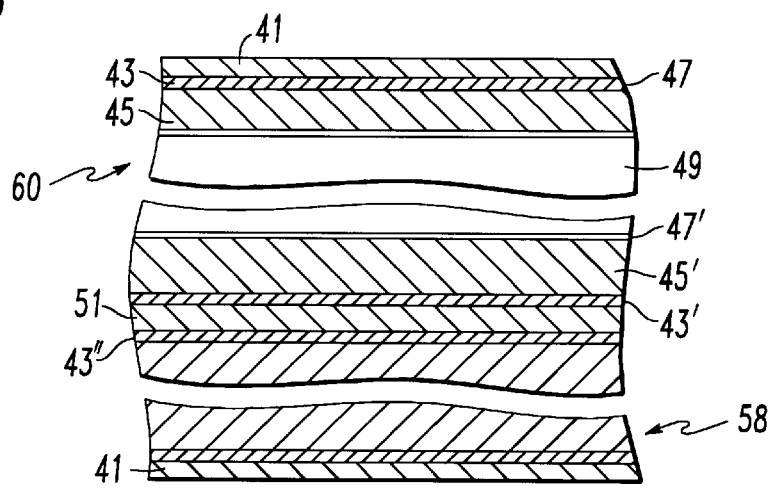
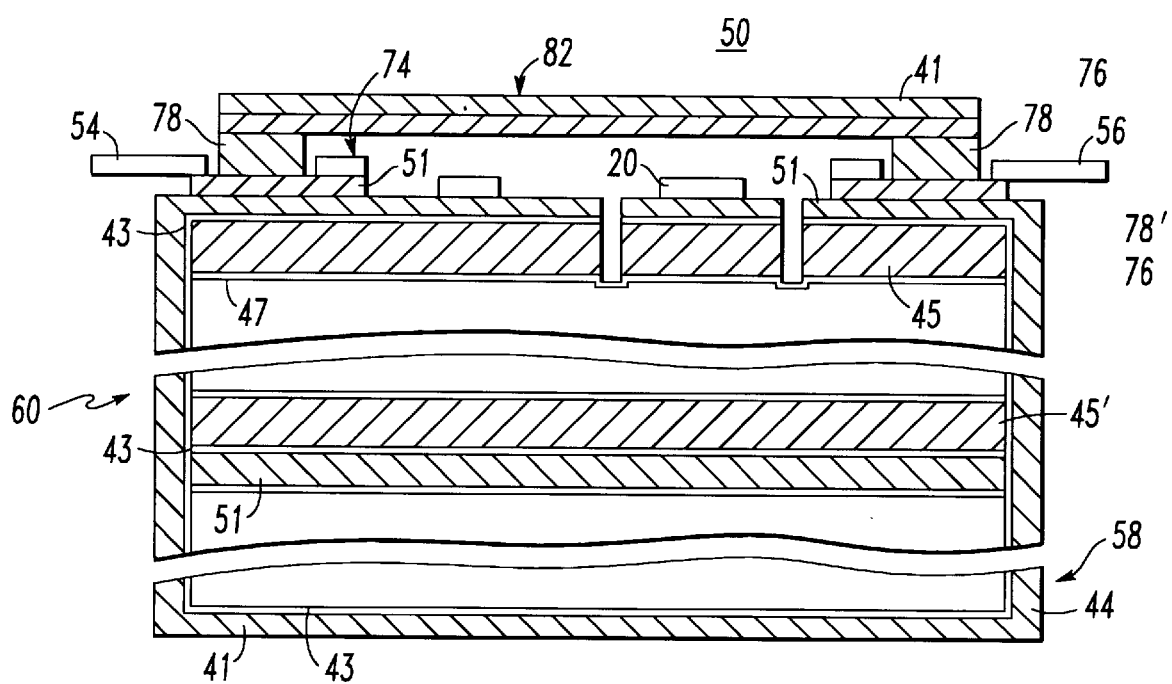
FIG.6

THICK FILM COPPER METALLIZATION FOR MICROWAVE POWER TRANSISTOR PACKAGES

This application is a continuation of application Ser. No. 07/793,233 filed Nov. 8, 1991 which is a continuation of Ser. No. 08/453,287 filed Dec. 22, 1989, abandoned.

FIELD OF USE

The present invention relates to heat dissipation of circuit components; and more particularly, to a module, package, and related method for power semiconductor circuit components. While the invention is subject to a wide range of packages and components, it is especially suited for power microwave transistor packaging and modules; and will be particularly described in that connection.

DESCRIPTION OF RELATED ART

One of the more recent categories of transistor components to replace power vacuum tubes having a corresponding function, is the high frequency power transistor. The large power output and the accompanying heat generated during operation of such a power source, for some time, prevented full realization of the reliability, reduced cost, and miniaturization of solid state circuitry.

A power transistor module typically is comprised of a cold plate of aluminum or other heat conductive material. Mounted on each plate are several packaged power transistor typically connected to appropriate input and output terminals, together with other electronic components mounted on the same plate. The heat generated by the several transistors conducts to the aluminum plate, which may be either liquid or air cooled.

Each transistor of the power module typically includes several power transistors, such as four for example, each of which contributes to the generation of heat. The active cell areas of the transistors are mounted on a central portion of a metallized ceramic substrate. The ceramic substrate in turn is brazed between a metallic base or flange portion of the package, and a frame seal assembly. The central portion of the substrate on which the active cell areas of the power transistors are mounted, is electrically isolated from the remaining portions of the substrate. Terminal strips for external electrical connections are mounted in the frame and seal assembly, and are electrically isolated from the substrate and from each other. A metallic cap is eutectically bonded to the frame for hermetically sealing the transistors in the package.

A fragmentary sectional view of a typical substrate and base assembly for a power transistor package is illustrated in FIG. 13. A block 20 of power transistor cells includes a silicon die or substrate 22 which is mounted on a metallized ceramic substrate generally referred to at 24, which in turn is brazed to a metallic base 26. Substrate 24 has a beryllium oxide (BeO) core 28 in the neighborhood of approximately 40 mils thick. A coating 30 of molymanganese (MoMn) is silk screened to all surfaces of the beryllium oxide core to a thickness of approximately 0.7 of a mil. The layer of MoMn is required to provide good adhesion between the ceramic core and the adjoining metal layer during subsequent high temperature assembly processes. The molymanganese coated substrate is plated on opposite sides with a layer of nickel 32 that is approximately 0.1 of a mil thick. The nickel plate adheres to the molymanganese film and provides a surface to which the gold layer 40 can be plated. Base or flange member 26 typically has an elkonite core 34, which is a tungsten copper mixture; and is nickel plated with a coating 36 on opposite sides thereof approximately 0.1 of a mil in thickness. Base member 26 and substrate 24 are fastened together by brazing with a brazing material such as a silver-copper alloy (Ag—Cu). A preform of such brazing material referred to at 38 is used, which is approximately one mil thick. After members 24, 26 are bonded together by brazing, the entire assembly is gold plated with a coating 40 of gold approximately 0.15 of a mil in thickness. A plurality of such packages are mounted on an aluminum plate 42.

Beryllium oxide core 28 of substrate 24 provides good thermal conductivity as well as high electrical resistivity, but has toxic characteristics that complicate the handling thereof. Molymanganese layer 30 which provides effective adhesion between the ceramic and the nickel plating during brazing and other high temperature assembly processes, but it has been discovered that the molymanganese film increases the inter-facial thermal resistance of the metallized ceramic substrate of the package, which limits the removal of heat and thus the maximum power output of the transistors.

Referring to FIG. 12, a conventional substrate 24 of beryllium oxide is coated with approximately 0.7 of a mil of molymanganese, and approximately 0.1 of a mil of nickel 32 followed by 0.15 of a mil of gold 40. As shown in FIG. 12 by dashed lines 29, heat emanates from the junctions of active cell areas 21 of transistor block 20 mounted on die 22, such as silicon, for example. The heat from block 20 spreads to a limited extent through the thin gold and nickel layers prior to entering the beryllia core. An article entitled "Temperature Effects Examined for Microwave Power Transistor Performance and Thermal Design Considerations" published in the November 1985 issue of MSN and Communications Technology, describes in detail the effects of temperature in power transistors; and the influence of chip design, and pulse and continuous wave operation on actual temperature.

Such module, packages, and substrates as shown in FIGS. 12 and 13 are satisfactory for the purposes intended, in that these and similar type mountings have a relatively high thermal conductivity, and permit power transistors and the associated circuitry to replace the Klystron, Magnetron, travelling wave, and cross-field amplifier, for example, in power source modules for microwave applications.

A power transistor package and module not only requires sufficient thermal conductivity to dissipate heat, it also is required to withstand high operating temperatures of a high frequency power microwave transistors, in excess of 200° C., for example, for certain applications. Thus, the materials utilized and the process steps in making the package necessarily require high temperatures well in excess of the expected operating temperature. The individual elements of the package are required to withstand a brazing temperature in the neighborhood of 800 to 900 degrees, the first step in assembling the package. Each successive step of assembly of the package requires a lower processing temperature than the previous step, with the final step of eutectic bonding being at the lowest processing temperature of approximately 280° C., for example. The heat build-up in such devices does not affect the integrity of the package itself, provided that it remain below the lowest processing temperature utilized in fabricating the package. However, the operation and failure rate of the transistors themselves suffer when subjected to temperatures, even below 200° C. particularly over an extended period of time.

Thus, in order to provide for long life and reliability of the power transistors, it became imperative to limit the operating temperature of the package. Since the amount of heat generated is a function of the amount of power generated by the transistors, the amount of heat capable of being dissipated by the package and the module determine the maximum power output of each of the transistors utilized for a particular application. In one application, where four transistors were packaged as shown in FIG. 12, it was determined that in order to maintain a specified maximum operating temperature in the neighborhood of 125° C, the output power of each package of four transistors was required to be limited to approximately 170 watts. At this wattage, the heat could be dissipated from the silicon die of the transistors through the gold, nickel, and molymanganese layers, the beryllium oxide, the base member, and the aluminum cold plate to maintain the die at approximately 125° C. Since the total amount of power required for a power amplifier of a radar transmitter, for example, is in the neighborhood of one hundred kilowatts, the number of transistor packages, and thus the modules required is substantial. Because of the cost and space requirements for such a large number of transistors packages, several approaches have been considered for increasing the power output of the transistors while maintaining the reliability of the power source modules for an extended length of time. One approach involves constructing the active cell area of silicon carbide, for example, which permits the transistor to reach a temperature above 125° C. without deleterious effect. Another approach involves increasing the active cell area of the transistor, which permits the output power to be increased without a corresponding increase in the temperature of the package. The increase in the active cell area, of course, increases the cost of the overall system and the size of the individual components.

SUMMARY OF INVENTION

One of the objects of the present invention, is to provide a power transistor module and related method that provides for increased power density levels without a corresponding increase in active cell area or the size of the package, while still maintaining transistor temperature specifications.

Another object of the present invention is to provide a package and related method for transistor power components which permit an increase in power output for a given number of transistors at a given operating temperature.

Still another object of the present invention is to provide an improved package and related method for dissipating the heat generated by power transistors.

A further object of the present invention is to provide a metallized ceramic substrate and related method for supporting power transistor components capable of withstanding the heat of subsequent high temperature processing, while simultaneously providing good electrical resistivity and high thermal conductivity.

A further object of the present invention is to provide a microwave transistor package and module capable of removing enough heat for maintaining a transistor block at a temperature not greater than 125° C. at a power output of 200 watts.

A still further object to the present invention is to provide such a substrate and related method capable of utilizing ceramic materials having a relatively low toxicity.

A still further object of the present invention is to provide a metallized ceramic substrate capable of providing optimum spreading of the heat generated by power components mounted on an electrically isolated surface thereof.

A still further object of the present invention is to provide a method of applying a copper layer having low thermal resistivity to a ceramic core that will permit the copper layered ceramic to be subjected to temperatures up to 900° C. without blistering.

An additional object of this invention is to provide a heat dissipation path of high thermal conductivity for a power transistor package that includes an electrically isolated central portion of a metallized ceramic substrate and a brazed joint in the path.

Additional objects and advantages of the invention will be set forth in part in the description which follows, and in part will be obvious from the description, or may be learned by practice of the invention. The objects and advantages of the invention may be realized and obtained by means of the instrumentalities and combinations particularly pointed out in the appended claims.

To achieve the objects and in accordance with the purpose of the invention as embodied and broadly described herein, there is provided a heat dissipating path for a power transistor, comprising in sequence a first layer of gold on which the transistor is mounted; a first layer of nickel on which the gold is plated; a first layer of unblistered copper on which the nickel is plated having a thickness sufficient to spread the heat laterally in the layer; a first film of metallic bonding material on a ceramic surface, the material having a low thermal resistance with characteristics effective to bond the first layer of copper to the ceramic surface; a ceramic piece of substantially uniform thickness; a second thin film of low thermal resistant metallic bonding material on an opposite surface of the ceramic piece identical to the first film; a second thick layer of copper bonded to the opposite surface of the ceramic piece by the second thin film, and a second layer of nickel similar to the first layer plated to the second copper layer.

In another aspect, there is provided a substrate for mounting power transistors wherein the substrate has a ceramic core with first and second opposite planar surfaces, each of the planar surfaces having a thick layer of unblistered copper bonded thereto by a low thermal resistant metallic film, and a layer of nickel having a thickness substantially less than the plated copper layer, at least a portion of the copper and nickel layer of said first planar surface being electrically isolated. The thickness of the copper layer effectively spreads the heat emanating from a plurality of power transistors mounted on the one electrically isolated planar surface laterally in the layer.

In still another aspect, there is provided a method of making a substrate for supporting power transistors on an electrically isolated surface of a ceramic core; by depositing a thin metallic film having low thermal resistance and characteristics effective to bond a copper layer to the ceramic core, depositing an initial portion of a total layer of copper to the film covered core, depositing a frame of resist material on the deposited initial portion of the copper layer having an annulus of predetermined width defining the boundary of the isolated surface and a thickness approximately corresponding to the total thickness of the copper layer; electroplating the remaining portion of the copper layer to the exposed initial portion of the copper layer removing the annular frame of resist material to expose the annular frame of the initial portion of the layer; and etching both the exposed initial portion and electroplated remaining portion of the copper layer sufficient to remove the thickness of the initial portion of the copper layer and the bonding material exposing the ceramic surface of the core throughout the width of the annulus beneath the area of the removed resist.

In a further aspect, there is provided a power transistor package, comprising a metallic base member; a substrate having a ceramic core with first and second opposite planar surfaces, each of the planar surfaces having a layer of copper bonded thereto by a low thermal resistant metallic film having characteristics effective to bond the copper layer to the core without blistering upon subsequent application of heat for brazing, a layer of nickel having a thickness substantially less than the copper layer plated on the copper layer, at least a portion of the copper and nickel layer of said first planar surface being electrically isolated, the copper layer having a thickness to spread heat laterally in the layer from a plurality of power transistors mounted on the one electrically isolated planar surface, the second planar surface being brazed to the metallic base member; a frame assembly brazed to either one of the substrate or base member surrounding and spaced from the electrically isolated planar surface of the substrate for connecting electrically at least two terminals of each of a plurality of power transistors to the exterior of the respective package, the two terminals being electrically isolated from the substrate and the base member and from each other; a plurality of power transistors mounted to the electrically isolated planar surface of the substrate; and a metallic cover bonded to the frame assembly for hermetically sealing the plurality of transistors within the package.

In a still further aspect, there is provided a power transistor module and related method, comprising a thick thermally conductive metallic plate for supporting a plurality of electronic components; a plurality of spaced, capacitive, and resistive components mounted on the metallic plate; a plurality of power transistor packages spaced from the capacitive, and resistive components and from each other, mounted on the metallic plate; the plurality of components, and the transistors being interconnected electrically to produce an alternating output signal of a predetermined wattage. Each transistor package includes a metallic base member attached to and in physical engagement with the metallic plate for conducting heat from the base member to the metallic plate; a substrate having a ceramic core with first and second opposite planar surfaces, each of the planar surfaces having a layer of copper with a thickness in the range of approximately one-half to seven mils bonded thereto by a low thermal resistant metallic film without blistering, and a layer of nickel plated on the copper layer, at least a portion of the copper and nickel layer of said first planar surface being electrically isolated from the base member, the copper layer having the characteristics and thickness to spread heat from the plurality of power transistors mounted on the one electrically isolated planar surface, the second planar surface being brazed to the metallic base member; a frame assembly brazed to either one of the substrate or base member surrounding and spaced from the electrically isolated planar surface of the substrate for connecting electrically at least two terminals of each of the plurality of transistors to the exterior of the respective package, the two terminals being electrically isolated from the substrate and the base member and from each other; a plurality of power transistors mounted to the electrically isolated planar surface of the substrate; and a metallic cover bonded to the frame assembly for hermetically sealing the plurality of transistors within the respective package.

Preferably, in all the above aspects, the bonding material is sputtered on the ceramic core, and the copper layer, at least initially, is sputtered on the bonding film coated core.

In still another aspect, there is provided a method of making a low thermal resistant metallized ceramic cored substrate capable of being subjected to temperatures in excess of 500° C., comprising the steps of degreasing and rinsing the ceramic core, subjecting the degreased and rinsed ceramic core to argon plasma cleaning, sputtering a thin film of metallic bonding material to the argon plasma sputtered core, sputtering/plating a layer of copper on the thin film of metallic bonding material, and coating the layer of copper with a layer of nickel.

Preferably, in all aspects, the metallic base member is composed of a tungsten copper mixture that is nickel plated. Preferably, in all aspects, the bonding material for the copper layer is a film approximately 20 to 80 nanometers thick composed of one of the group consisting of chromium, titanium, molybdenum, tungsten, and titanium-tungsten.

Preferably, in all of the above aspects, the copper layers each have a thickness in the range of from 0.5 mil to 7 mils.

The accompanying drawings, which are incorporated in and constitute a part of this specification, illustrate preferred embodiments of the invention, and, together with a description, serve to explain the principles of the invention.

BRIEF DESCRIPTION OF THE DRAWINGS

FIG. 5 illustrates a heat dissipating path which is a highly exaggerated, greatly magnified, fragmentary section of the metallized ceramic substrate and the flange or base portion assembly taken on line 5—5 of FIG. 4;

FIG. 6, is a highly exaggerated greatly magnified vertical cross-section of the power microwave transistor package of FIGS. 2 and 3 taken on line 6—6 of FIG. 2 and additionally schematically includes a block of several power microwave transistors mounted on the island area as illustrated in FIG. 4;

DESCRIPTION OF THE PREFERRED EMBODIMENTS

Figure 1:
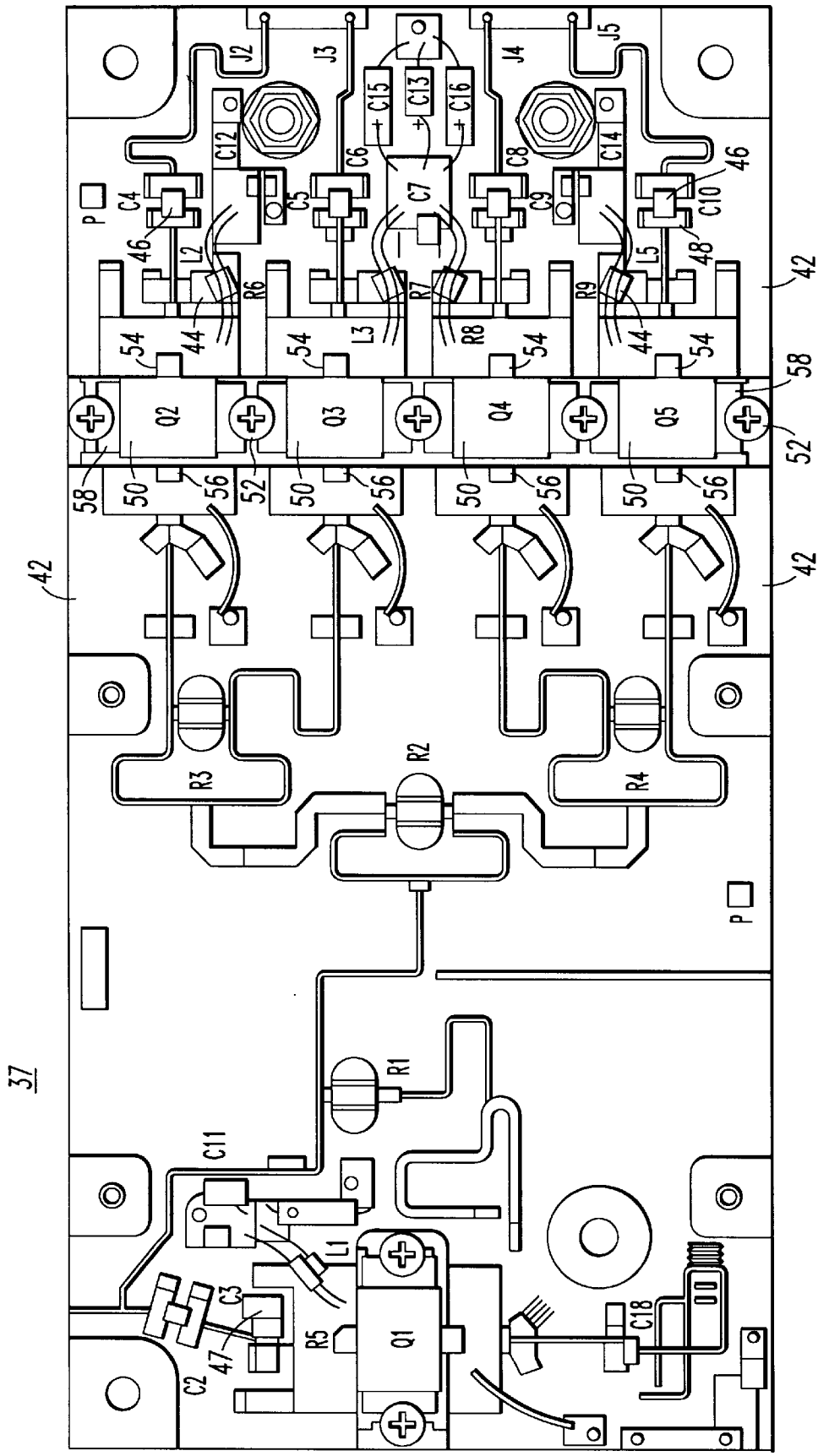
FIG. 1, is a schematic view of a power amplifier module utilizing several power microwave transistor packages, and incorporating the teachings of the present invention.

Reference will now be made in detail to the present preferred embodiments of the invention, examples of which are illustrated in the accompanying drawings. Like reference numerals refer to like parts in the various Figures of the drawings.

In accordance with the invention, a heat dissipating path is provided for a block of transistors, comprising a gold layer on which the block of transistors is mounted, a nickel layer to which the gold layer is plated and a thick copper layer to which the nickel layer is plated.

As embodied herein and referring to FIG. 5, the heat dissipating path comprises a layer of gold 41, which is preferably 0.15 of a mil thick, to which a block of transistors (not shown) is fastened such as by eutectic soldering with a gold/silicon solder.

The gold layer is plated to a first layer of nickel 43 which is preferably 0.10 of a mil thick. First nickel layer 43 in turn is plated to a first layer of copper 45, which is preferably the well known high conductivity oxygen free type, that has a thickness in the range of between 0.5 and 7 mils thick depending on the application. A thickness much greater than 7 mils tends to dilute the advantages of the low thermal resistance and heat spreading of the present invention.

The heat dissipating path of the present invention further includes a metallic bonding film for bonding the first copper layer to a ceramic substrate that provides low thermal resistance, yet bonds the copper to the ceramic piece without blistering when subjected to high temperatures between 500° C. and 900° C. during package assembly, and the path includes the ceramic piece itself. As herein embodied and again referring to FIG. 5, metallic bonding film 47, which is preferably in the range of between 20 and 80 nanometers in thickness, is preferably of material from the group that consists of chromium, titanium, tungsten, molybdenum, and titanium-tungsten. In one actual reduction to practice, chromium is used. Ceramic piece 49 is preferably of uniform thickness in the range of 7 to 40 mils, and may be material such as the conventional beryllium oxide, or silicon carbide, or aluminum nitride.

The heat dissipating path of the present invention further includes in succession a second thin film 47' of metallic bonding material on another surface of the ceramic piece, a second copper layer 45' having a thickness similar to the first copper layer bonded to the other surface of the ceramic piece by the second film of bonding material, a second layer of nickel 43' plated on the second copper layer, and a metallic piece brazed to the second layer of nickel. Referring again to FIG. 5, and as herein embodied a metallic piece 58 has a third layer of nickel 43" with brazing material 51 interposed between the second and third nickel layers 43' and 43". Although, the thickness of the second and third nickel layers may vary, preferably, each one in approximately 0.1 mil thick. In actual practice, brazing material 51 is preferably approximately one mil thick (not shown to scale in the drawings). In accordance with the invention, a power transistor module, for example, which utilizes the heat dissipation path herein, permits an increase of approximately 25%, equalling 50 watts of additional power for each transistor package while maintaining and limiting the temperature of the transistor block to approximately 125° C. Such a module is described in connection with FIG. 1. Although, it is desirable to operate the transistors at the lowest temperature obtainable, the present invention will enable packaged transistors to generate even greater power at temperatures above 125° for applications where higher temperatures are acceptable.

Referring to FIG. 1, a power generating transistor module, such as a power amplifier, is referred to generally as 37. Module 37 comprises metallic plate 42, preferably aluminum, on which is mounted a plurality of resistors, such as 44, a plurality of capacitors such as 46, and a plurality of inductors such as 48. The module of the invention includes a plurality of spaced power transistor packages 50 connected operatively for example, to resistors 44, capacitors 46, and inductors 48, mounted on metallic plate 42. Each package 50 is fastened to be in direct physical engagement with the opposing surface of metallic plate 42 by screws 52 which are threaded into plate 42 (not shown). Tabs 54 and 56 which are electrically connected to emitter and collector terminals, respectively of power microwave transistors in corresponding package 50 are connected through suitable leads to various electronic components on plate 42. Module 40 is intended to be exemplary of a module that includes a plurality of power microwave transistor components capable of outputting a waveform of predetermined power.

In accordance with the present invention, each hermetically sealed package 50 is attached to metallic plate 42 for conducting heat from a metallized copper layered ceramic substrate supporting a plurality of power microwave transistors through a flange member secured to the metallic plate.

Figure 2:
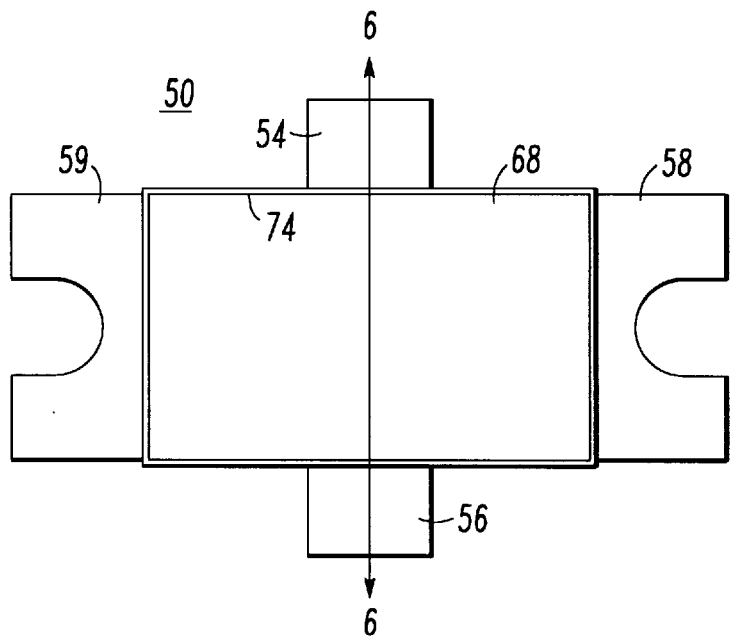
FIG. 2, is a plan view of a power microwave transistor package incorporating the teachings of the present invention.
Figure 3:
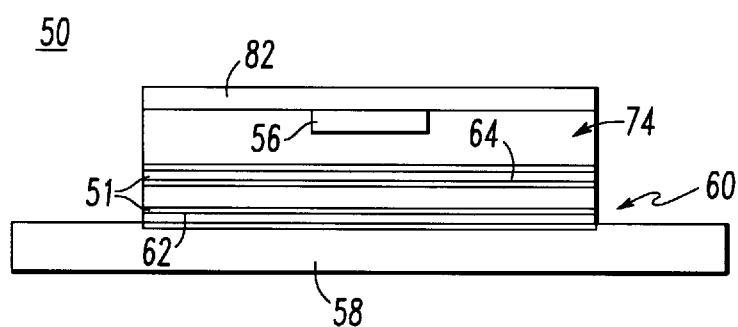
FIG. 3, is a view in elevation of the power microwave transistor package of FIG. 2.
Figure 4:
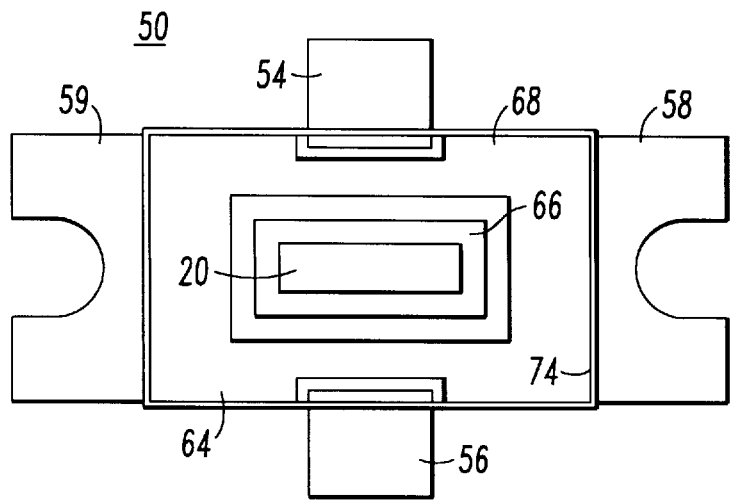
FIG. 4, is a plan view of the power microwave transistor package of FIG. 2 with the cover removed to illustrate a surface of the metallized substrate having an electrically isolated island area upon which power microwave transistors are mounted.

As herein embodied and referring additionally to FIGS. 2 through 4, each package 50 includes metallic base member 58 having recesses 59 for attaching to the plate 42 as previously described. A metallized ceramic substrate 60 having low thermal resistant characteristics and heat spreading configuration, is brazed at planar surface 62 to member 58 by brazing material 51.

The term brazing when used in this specification is meant to refer to any method of fusing or attaching two metallic pieces to one another by melting a material requiring at least 500° centigrade to effect the attachment. This term is meant to exclude conventional soldering that is effected below 500° C., but may include gold indium soldering that requires a temperature of approximately 500°, for example.

A lower temperature solder is ineffective for the present invention because of subsequent high temperature processing steps needed in assembling the transistor, and possible operating temperatures of the power microwave transistors. In one actual reduction to practice, brazing material 51 for brazing each base member 58 to a corresponding substrate 60 was composed of a mixture of silver and copper. With this mixture, the package could be brazed at a temperature in the neighborhood of 800° to 900° C.

Figure 11:
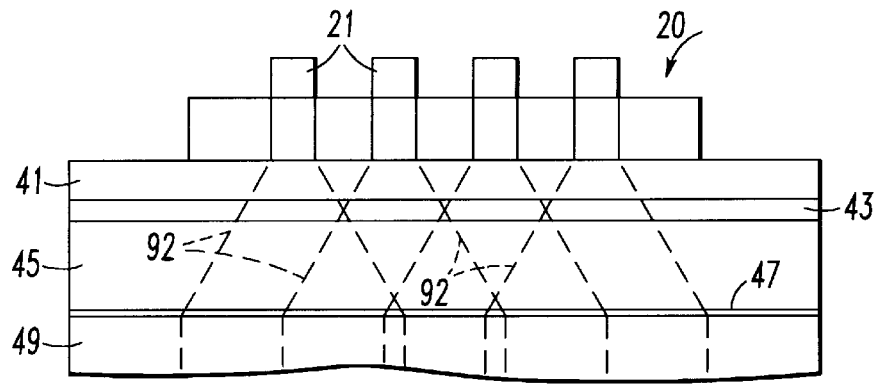
FIG. 11 is a fragmentary sectional view of a substrate showing the manner in which heat spreads from four transistor cells packaged in accordance with the present invention.
Figure 12:
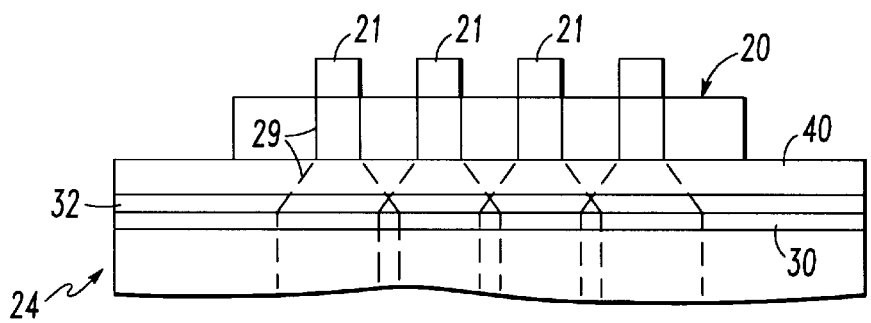
FIG. 12 is a fragmentary sectional view of a prior art substrate showing the lack of heat spreading from a four transistor cell block.
Figure 13:
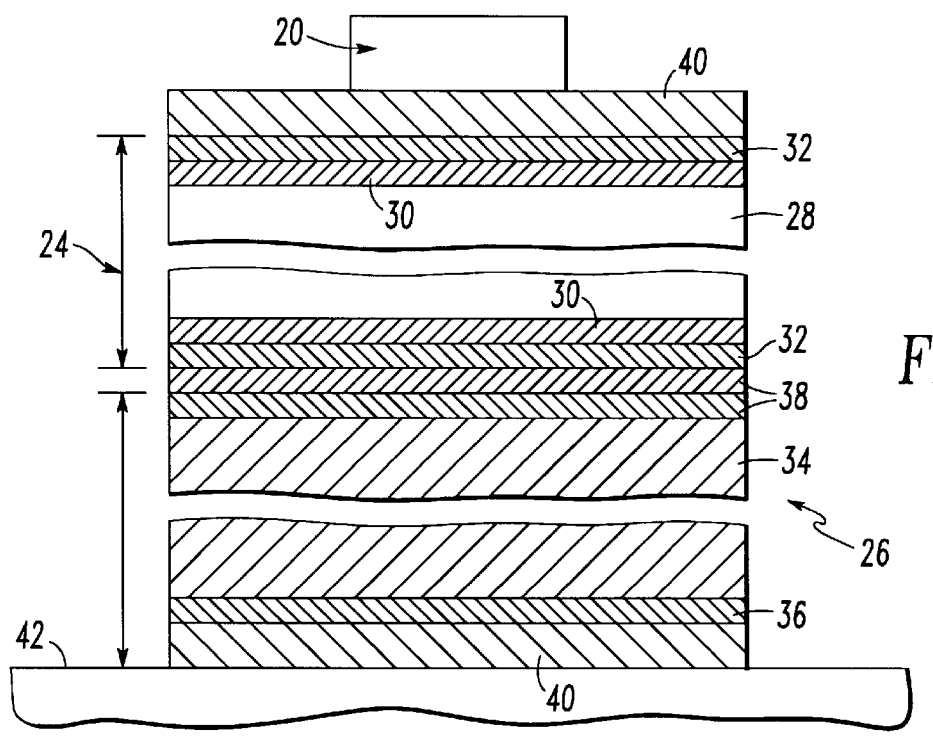
FIG. 13 is a fragmentary highly magnified elongated view in cross-section of a conventional substrate assembly mounted on a metallic plate.

The metallized ceramic substrate 60 which has opposite planar surfaces 62 and 64, has an electrically isolated centrally disposed metal coated island 66 (FIG. 4) for supporting a block 20 of power microwave transistors (FIG. 6). In accordance with the invention, substrate 60 includes relatively thick layers of copper 45 and 45' bonded directly to ceramic 49 of substrate 60 by a relatively thin film of metallic bonding material 47. The layers 45 and 45' exemplified in FIGS. 5 and 6, have a thickness sufficient to spread the heat from power microwave transistors mounted on island portion 66 laterally and conduct the heat with low thermal resistance between the thick bonded copper layer, and ceramic 49 of substrate 60. Nickel layer 43 serves as a barrier between gold plating 41 and copper layer 45, and between brazing material 51 and copper layer 45'. Power microwave transistor cells, typically eight, (see FIG. 11) are included in a block, which is mounted on, and in direct physical engagement with gold plating 41 of metallized island 66.

Package 50 of the invention, also includes a frame seal assembly for connecting the power component externally of the package as previously mentioned. As embodied herein, a frame seal assembly 74 (FIG. 3) is brazed to substrate 60 adjacent a peripheral surface thereof by brazing material 51. Any suitable frame seal assembly may be used that is able to maintain its integrity during brazing of the power microwave transistor package. Fabrication of typical frame seal assemblies such as 74, per se, are well known and the details of construction of such frame seal form no part of the present invention. However, it should be noted that frame seal assembly 74 is assembled into an integral unit and co-fired at temperatures of over 1000° C. Prior to being brazed to nickel plate 43 of substrate 60. After a block 20 of microwave power transistors are mounted on island 66, and electrically connected by wire bonding, a cover, which may be made of Kovar 82, is eutectically bonded to frame seal assembly 74 to hermetically seal the transistors in a cavity defined by the frame seal assembly, metallized surface 62 of substrate 60 and the inner surface of frame seal assembly 74. Kovar cover 82 is eutectically bonded to frame seal assembly 74 by gold/tin solder as previously mentioned in a well known manner at a temperature of approximately 280° C.

Base member 58 of the present invention is preferably a well-known tungsten copper mixture, such as Elkonite, having a uniform thickness of approximately 60 mils, which is plated with approximately 0.1 mil of nickel.

Brazing material 51 is preferably, a mixture of silver and copper that brazes at a temperature of approximately 800° to 900° C. Preforms approximately one mil thick are preferably used, but they may be thicker or thinner depending on the application. As previously mentioned, if gold indium is used, frame assembly 74 and base member 58 may be fastened to substrate 60 at a temperature of approximately 500°.

Ceramic core 49 of substrate 60 is composed of a material that is an electrical insulator, but is able to conduct heat with relatively little resistance. However, in realizing a part of the objects of the invention, the ceramic material can be preferably, either beryllium oxide, aluminum nitride, or silicon carbide. However, in order to attain the advantage of the invention that permits greater ease of manufacture and handling, it is preferable that the substrate be made of either aluminum nitride or silicon carbide. In one actual reduction to practice, the ceramic core is composed of beryllium oxide and has a thickness of approximately 40 mils. To effectively attain the advantage of heat dissipation, ceramic cores having a thickness in the range of 7–25 mils is preferable.

A thin film of metallic bonding material which may be approximately 20 to 80 nanometers in thickness, is represented by a heavier line 47, 47' defining opposite surfaces of core 49. Preferably, the metallic bonding material is either chromium, titanium, molybdenum, tungsten, or titanium-tungsten. In one actual reduction to practice, chromium is used as the bonding material.

Copper layers 45, 45', bonded to substrate 60 are preferably composed of an oxygen free, high conductivity type copper, because of its excellent conductivity properties. The thickness of each layer of copper 45, 45' should be sufficient to spread the heat laterally to enter the ceramic core over a larger area and to spread, laterally in metallic base member 58. Preferably and depending upon the particular application, the layer of copper may be in the range of approximately 0.5 to 7 mils. For certain applications, such as continuous wave or high pulse repetition rate generated power, it is preferable to provide a heat dissipating copper layer in the neighborhood of 0.5 to 2.5 mils thick. For medium and low pulse repetition rates, the copper layer is preferably in the range of between 2.5 and 7 mils. In one actual reduction to practice, a copper layer having a thickness of 2.5 mils was found to effectively dissipate the generated heat for most radar transmissions.

In accordance with the present invention, a copper layer is deposited on the substrate to a thickness that is effective in spreading the heat laterally from the active cell areas to a large area of the ceramic without encountering interfacial thermal resistance as it passes from the copper layer to the ceramic core. As herein embodied and referring to FIG. 11, the increase in lateral spreading of the heat is a function of the additional thickness of copper layer 45 over the thickness of the gold and nickel of the prior art. Such spreading is represented by lines 92 of FIG. 11. Although not shown, in FIG. 11, such heat is further spread as it travels in the path through the second layer of copper 45' (FIG. 5). As embodied herein, the invention includes layer of nickel 43, having a thickness substantially less than each copper layer, plated on respective copper layer 45, 45'. As previously mentioned in connection with base member 58, nickel layer 43, a layer of nickel approximately 0.1 of a mil in thickness is preferable for most applications.

Each package 50 of the present invention includes a frame assembly brazed to either one of the substrate or base members surrounding and spaced from the electrically isolated planar surface of the substrate for connecting electrically at least two terminals of each of the plurality of transistors to the exterior of the respective package, with the two terminals being electrically isolated from the substrate and the base member and from each other.

As herein embodied, and referring additionally to FIG. 6, a frame assembly 74 is comprised of metallic coated alumina frame members 78 for electrically isolating tabs 54 and 56 from metallic surfaces of package 50 and from each other. As previously mentioned, frame assembly 74 may be a conventional frame assembly that is fabricated prior to assembly of the package. Frame assembly 74 may be brazed to nickel plate 43 on copper layer 45 by an annular preform 51, which is preferably of the same brazing material as used in bonding substrate 60 to base member 58. The brazed assembly of base member 58, substrate 60, and frame assembly 74 is preferably gold plated with a layer approximately 0.15 mil thick. Cover 82 may be made of a well known metal Kovar. As mentioned previously, the cover is bonded to gold plated frame assembly 74 by a gold/tin solder 79.

Figure 8:
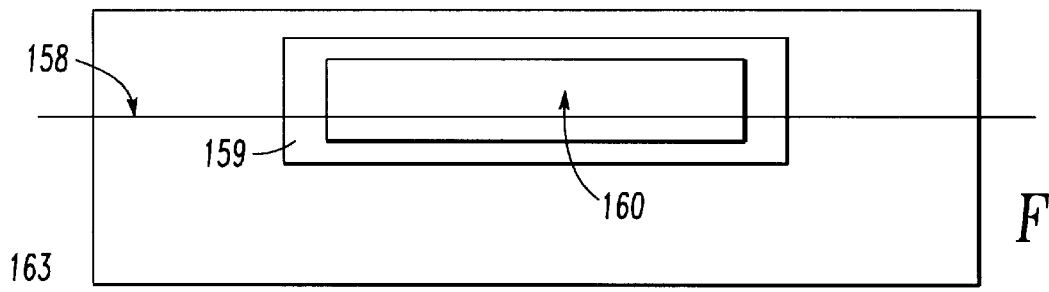
FIG. 8 is a plan view of an insert package, base member and substrate assembly portion of a power microwave package constructed in accordance with another embodiment of the invention.
Figure 9:
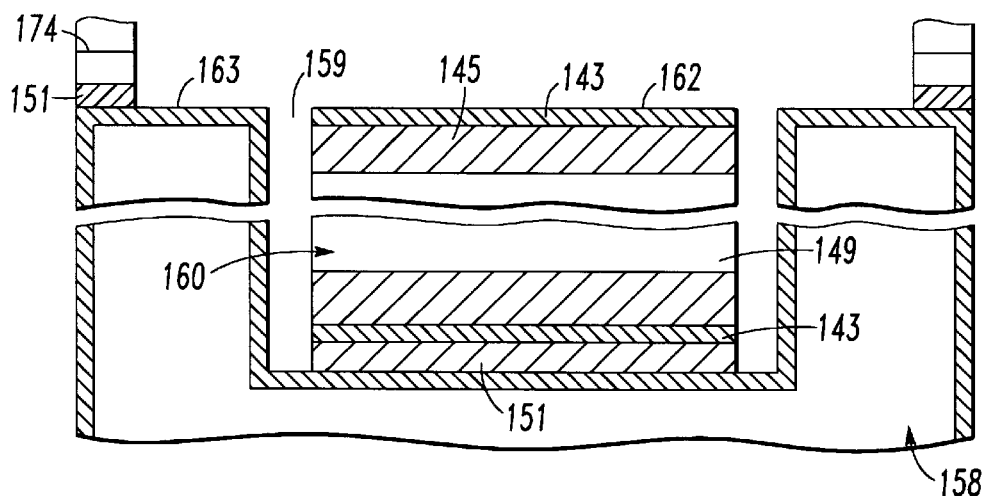
FIG. 9 is a highly exaggerated magnified view of a substrate and base assembly of the power microwave transistor package of FIG. 8.

Referring to FIGS. 8 and 9, a second embodiment of a power microwave semiconductor package without the gold plating is referred to as the insert package 150. Package 150 is similar to package 50, except that a base member 158 has a rectangular recess 159 corresponding substantially to the total thickness of a substrate 160 less brazing material 151, which is inserted into recess 159. The entire substrate 160 constitutes the electrically isolated island. Substrate 160 has opposite planar surfaces, which have copper and nickel layers 145 and 143 bonded to ceramic core 168 similar to the previous described embodiment. Brazing material 151 fastens substrate 160 to base member 158 in the same manner as the previously described embodiment. Frame assembly 174 is brazed to base member 158 by annular preform 151 instead of the substrate as in the previous embodiment.

In fabricating a power microwave transistor package or module of the present invention, and mounting the transistors therein the individual components, namely, base member 58, substrate 60, frame assembly 74, preforms 51, and cover 82 are first completely fabricated and nickel-plated where applicable. Frame assembly 74, is completely assembled conventionally prior to assembling package 50 at a co-fired temperature in excess of 1000° C. Thus, frame assembly 74 is capable of maintaining its integrity when subjected to subsequent processing steps of less than 1000° C. The first high temperature process step in assembly package 50 is brazing substrate 60 to base member 58 and brazing frame assembly 74 to either substrate 60 or base member 158 depending upon the embodiment. In so doing, the base member and the substrate are subjected to temperatures in excess of 500° C. if brazed by gold-indium, and in the range of 800° to 900° C. if brazed with copper/silver brazing material. It is necessary, that the brazing temperature is sufficiently high so that subsequent processing steps as well as the operation of the transistors, occur at a lower temperature. It is also important that substrate 60 is not adversely affected during the brazing step. In this connection, copper layers, 45, 45' should not blister or separate from ceramic core 49.

Subsequent to brazing the assembly, the uncovered package 50 or 150 is preferably nickel and gold plated, and then transistor die 20 is fastened to island 66 of substrate 60 by gold-silicon solder that occurs at a temperature of approximately 410°–420° C. Wire leads of transistor 21 are fastened to tabs 40 and other internal electrical connections by conventional pressure bonding, and finally, cover 82 is eutectically bonded at approximately 280° C. to gold plated frame assembly 74 or 174 with gold/tin solder for hermetically sealing the transistors.

In fabricating substrate 60, ceramic core 49 is first prepared by de-greasing and rinsing. This may be accomplished by any well known method provided that the cleaning process is effective in removing all contaminants that would tend to cause the copper layers 45, 45' to blister or separate from the core during subsequent processing or during operation.

In accordance with the invention, an important step in preparing the ceramic substrate is plasma sputtering the ceramic surface with preferably an oxygen or argon plasma subsequent to the initial degreasing and rinsing steps.

In carrying out the preparations of the core as embodied herein, ceramic core 49 is first immersed in a well known glass cleaning solution, such as chromic/sulfuric acid, at approximately 60° C. ±3° C. for ten to fifteen minutes. The core is then rinsed in cold de-ionized water for ten to fifteen minutes. The double rinsed core is then immersed in boiling 2-propanol and allowed to boil therein for two to three minutes. The substrate core is then removed slowly from the boiling 2-propanol through the vapors to further degrease the core.

Prior to plasma sputtering, preferably, the cores are bias etched for five minutes at 500 W using a power source of 330 V. Then, the core is subjected to plasma sputtering with either the oxygen or argon plasma, for approximately two minutes at a power output of 700 watts at 190 volts.

Once, the cores have been plasma sputtered, bonding film 47 is preferably sputtered onto the core. One of the bonding materials previously mentioned is sputtered until it reaches a thickness of approximately 20 to 80 nanometers. In one actual reduction to practice chromium was sputtered on the core for two minutes at the same power and voltage as the previous plasma sputtering to obtain the required thickness.

Preferably, the method of the present invention further comprises plasma sputtering the surface of the sputtered bonding film to insure adhesion of the copper layer. As herein embodied this is followed by sputtering the copper on the plasma sputtered bonding film for approximately 40 minutes at the same power as the last mentioned plasma sputtering. Preferably, the copper layer is sputtered on the bonding film covered ceramic core to a thickness not exceeding approximately 3 mils. In the event that the copper layer is to be thicker, as previously discussed, it is preferable to electroplate the remaining thickness of the layer. The opposite side of the substrate is layered in the same manner. In one actual reduction to practice, both the bonding film and the copper were sputtered utilizing the well known RF frequency diode sputtering method. Although the preferred method includes RF sputtering, magnetron sputtering, E-Beam evaporation, or induction heating also may be utilized. Where it is desired that the copper layer be deposited in openings such as thru hole openings, for example, or at the edges of the substrate, sputtering with a bias voltage may be utilized. However, in the event such copper deposition is not desired on areas other than the planar surfaces of the substrate, sputtering without a bias voltage is satisfactory.

After the copper layer is sputtered to the proper thickness, place the substrate in ultrasonically agitated acetone for 5–10 minutes. Change the acetone and clean again for 5–10 minutes. Blow off the acetone and dry the substrates in a paper towel.

Then place the substrate in a "Neutra Clean" bath for 10–15 minutes at 55°–60° C., and water rinse with cold tap water for 1–2 minutes.

In accordance with the invention, a metallic island having a thick copper layer is electrically isolated from the remainder of package 50. This island may be centrally located in substrate 60, such as island 66 (FIGS. 4 and 6) or an insert type described in connection with FIGS. 8, 9, and 10.

Figure 7A:
FIGS. 7a through 7i inclusive illustrate the steps in fabricating the metallized ceramic substrate according to one embodiment of the present invention.
Figure 7B:
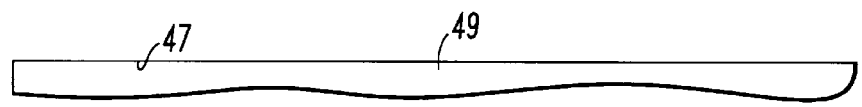
Figure 7C:
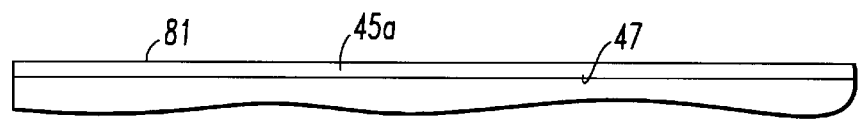
Figure 7D:
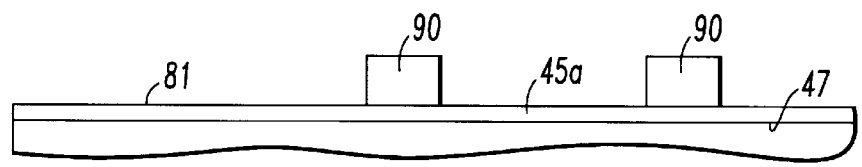
Figure 7E:
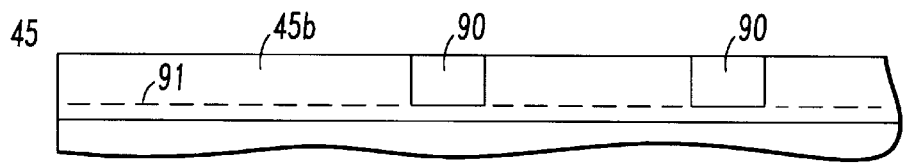
Figure 7F:
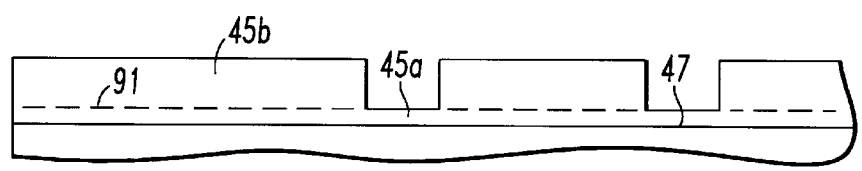
Figure 7G:
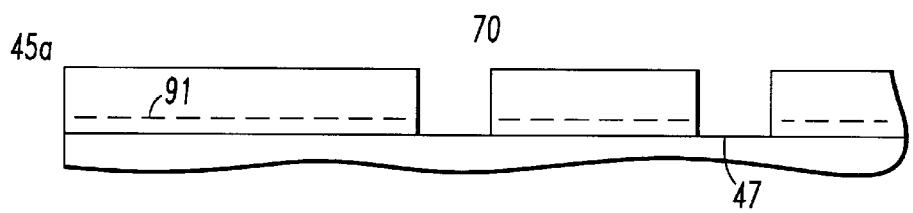
Figure 7H:
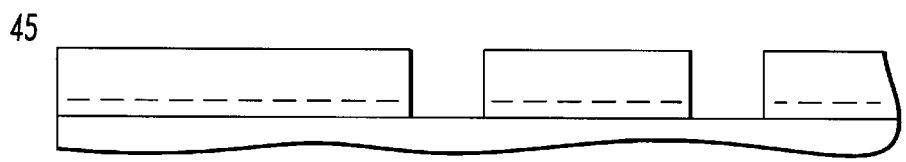

In fabricating the embodiment of FIGS. 4 and 6, and with reference to FIG. 7A, substrate 49 is prepared as previously described, the bonding film 47 is sputtered on the core as shown in FIG. 7b and as shown in FIG. 7C, between 0.5 and 3 mils of copper, referred to as 45a is disposed, preferably by sputtering the copper on bonding film 47. Then, an annular frame of resist 90 having an internal area corresponding to the configuration and size of the desired electrically isolated island 66 of substrate 60, is deposited on the sputtered copper layer centrally of the substrate as shown in FIG. 7D. The thickness of resist 90 preferably corresponds to the desired total thickness of copper layer 45. Following deposition of the resist 90, a copper layer portion 45b is electroplated onto copper layer portion 45a to a thickness substantially equal to the thickness of resist 90; or in other words, an electroplated thickness corresponding to the total desired thickness of copper layer 45 as shown in FIG. 7E. Following the electroplating of copper layer 45b, resist 90 is removed, exposing the thin sputtered layer portion 45a lying beneath annular resist frame 90 which defines the space between the electrically isolated portion 66 and the remainder of the substrate as shown in FIG. 7F. After deposition of layer portion 45b, layer portion 45a is defined by line 91 which is dotted where layer portion 45b covers 45a. The entire copper coated substrate is then etched with a standard copper etching solution sufficient to remove the thickness of the exposed thin sputtered copper layer 45a as shown in FIG. 7G. Such etching also removes a corresponding thickness of layers portion 45b of copper layer 45 which leaves layer 45 having the total desired thickness. Following removal of the thin copper from exposed copper layers 45a and 45b, an etching material suitable for removing thin bonding film 47 is applied for removing any trace of an electrically conductive surface or contact between the electrically isolated portion 66 and the remaining portion of the substrate as shown in FIG. 7H. In etching the copper, the substrates are immersed in ammonium persulfate at 40°–45° C. with 1 drop of ferric cyanide 93/100 ml of solution for 20 seconds with agitation. Then water rinse with cold tap water for 20–30 seconds. In etching the chrome, immerse in 50% hydrochloric acid solution of 70°–75° C. for 10 seconds with agitation. Rinse in cold tap water for 20–30 seconds.

For final cleaning, again place in "Neutra Clean" for 5–10 minutes at 55°–60° C., and then rinse with cold tap water for 1–2 minutes. Immerse in ammonium persulfate etching both for 2–3 seconds and blow the substrates dry with nitrogen.

Figure 7I:
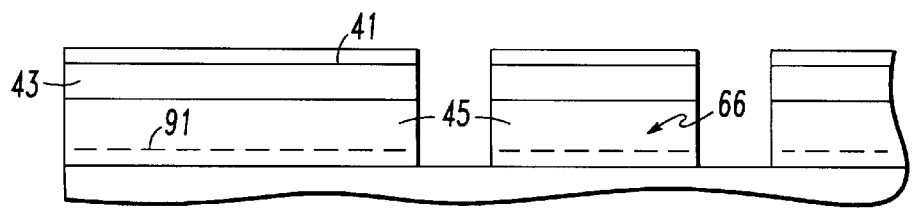

As shown in FIG. 7I, layer of nickel 43 is then electroplated to copper layer 45, and an outer layer of gold 41 is electroplated to nickel layer 43.

Figure 10:
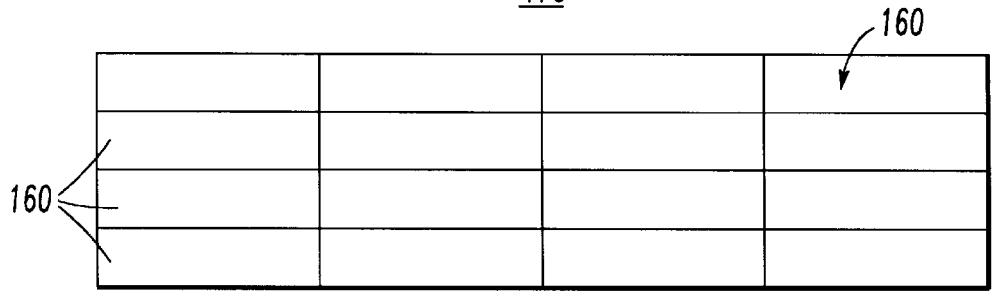
FIG. 10 is a blank illustrating a plurality of electrically isolated islands or inserts of FIG. 9 after nickel plating and prior to cutting up into individual pieces for use with the embodiment of FIG. 8.

In a variation of the method, particularly for the embodiment of FIG. 8 and 9 where a base member 158 has a recess 159 in one planar surface, and substrate 160 is disposed in recess 159 with the upper planar surface 162 of the substrate being substantially coplanar with surface 163 of base member 158, a large sheet of ceramic material 170 corresponding to the size of several substrates 160 is prepared as previously described and as shown in FIGS. 7A–7C. Copper layer is sputtered with copper, anywhere from 0.5 mil to 3 mils, for example. The remaining portion of the copper layer may then be electroplated on the sputtered layer to attain the total thickness. The copper layer is then plated with nickel. As shown in FIG. 10, a large sheet of copper 170 can be cut into the desired size and inserted in recess 159 of base member 158. Nickel layer 143 is plated to copper layer 145, regardless of which method is used, by conventional electroplating, and to any desired thickness as previously described.

A variation in the method of applying the copper layers to the desired ceramic may also be used for the embodiment of the package shown in FIG. 6, particularly where the total thickness of the copper is approximately 3 mils or less. Such a method involves preparing the substrate, then plasma sputtering of the chrome and copper layers as previously described. Photo resist is then applied to the substrate, except to the area corresponding to the annular moat for separating island area 66 from the remainder of the substrate. The copper and bonding material is then wet etched from the groove; and the remainder of the core stripped of the photo resist. For larger thicknesses of copper layers, the moat separating the electrically isolated island tends to be undercut making it larger than desired.

Once substrate 60 is completely fabricated and before application of the nickel plate, the substrate is checked for continuity between island 66 and the remainder of the substrate. If there is a chrome short, immerse in a chrome etchant at 70°–75° C. for 4–5 seconds, then water rinse for 25–30 seconds and complete by rinsing in isopropyl alcohol and blow dry with nitrogen. If it is a thin copper short, scrape the short lightly with a probe, immerse in Ammonium Persulfate etchant at 40°–45° C. for 10–15 seconds and water rinse for 25–30 seconds. Then follow the above procedure for a chrome short.

In summary, we have provided a metallization process which eliminates the MoMn bonding layer without impact on subsequent assembly procedures and which results in a significant increase in the thermal performance of the transistor package. In addition, the process includes a thick copper metallization directly below the silicon block providing efficient heat spreading where it is needed most. The technique is applicable to heat sink materials such as AlN and SiC. Owing to the toxic nature of BeO, these alternative heat sink materials offer reduced safety risks as well as improved handling capabilities which ultimately effect the cost of the package. In addition, increased thermal conductivity properties provide further improvement in the thermal performance of the packages.

The metallization process can be either magnetron or RF diode sputtering with or without bias voltages applied. They offer increased step coverage on the sidewalls of the ceramic which is important for our application described here as well as for through-holes for other substrate applications. Use of e-beam evaporation or induction heating deposition processes could be used if the application does not require good sidewall coverage. The current process also provides a plasma pre-sputter capability for final cleans prior to metal deposition. As mentioned, alternative metals can be used as a replacement for Cr. Bias voltage can provide increased sidewall deposition but is not a prerequisite to the process. Sputtered copper thicknesses range from 1 micron up to 3 mils. Electroplating of copper onto the sputtered chromium/copper base is the preferred process now for providing thick (0.5–7 mils) copper films. Standard Acid Cu plating solutions are used.

It will be apparent to those skilled in the art, that various modifications and variations can be made in the apparatus and methods of the present invention and in the construction of the module and package without departing from the scope or spirit of the invention provided they come within the scope of the appended claims and their equivalents. As an example, the thicknesses of the copper, nickel, and gold plating as well as the ceramic core may vary depending on the application.

We claim:

1. A power microwave generating transistor module, comprising:

a thermally conductive metallic plate for supporting a plurality of electronic components;

a plurality of spaced inductive, capacitive, and resistive components mounted on the metallic plate;

a plurality of power microwave transistor packages spaced from the inductive, capacitive, and resistive components, and from each other mounted on the metallic plate;

the plurality of components, and the transistors of the transistor packages being interconnected electrically to produce an alternating output signal of a predetermined wattage, each transistor package including:

a metallic base member fixedly attached to and in physical engagement with the metallic plate for conducting heat from the base member to the metallic plate, a substrate having a ceramic core with first and second opposite planar surfaces, each of the planar surfaces having a layer of copper with a thickness in the range of approximately 0.5 to 7 mils bonded to the ceramic core by a metallic film, a layer of nickel having a thickness substantially less than the copper layer plated on the copper layer, at least a portion of the first planar surface being electrically isolated from the metal base member for supporting a plurality of power microwave transistors, the copper layer having the characteristics and thickness to spread heat from a plurality of power microwave transistors mounted on the first electrically isolated planar surface, the second planar surface being brazed to the metallic base member;

a frame assembly brazed to one of either the metallic layer of the substrate or the metallic base member surrounding and spaced from the electrically isolated first planar surface of the substrate for connecting electrically at least two terminals exterior the respective package, the two terminals being electrically isolated from the substrate and the base member and from each other;

a plurality of power microwave transistors mounted to the electrically isolated first planar surface of the substrate; and a metallic cover bonded to the frame assembly for hermetically sealing the plurality of transistors within the respective package.

2. The module of claim 1 wherein the metallic base member of each of the plurality of transistor packages has opposite planar surfaces, the frame assembly is brazed to the first planar surface of the substrate surrounding and spaced from the electrically isolated portion of the first planar surface.

3. The module of claim 1 wherein the base member of each of the plurality of transistor packages is composed of a nickel plated tungsten copper mixture having a total thickness of approximately sixty mils.

4. The module of claim 1 wherein the brazed base member and substrate of each of the plurality of transistor packages is gold plated.

5. The module of claim 1 wherein the ceramic core of the substrate of each of the plurality of transistor packages is composed of one of the group consisting of beryllium oxide, aluminum nitride and silicon carbide.

6. The module of claim 1 wherein the ceramic core of the substrate of each transistor package has a thickness of approximately 7 to 40 mils.

7. The module of claim 1 wherein the bonding material for each copper layer is a film approximately 20 to 80 nanometers thick composed of one of the group consisting of chromium, titanium, molybdenum, tungsten, and titanium-tungsten.

8. The module of claim 1 wherein the brazing material for brazing the base member, substrate, and frame assembly to one another is a mixture of silver and copper.

9. The module of claim 1 wherein the plurality of transistors of each of the plurality of transistor packages includes a silicon die, and the silicon die is soldered to the electrically isolated first surface of the corresponding substrate with a gold silicon solder.

10. The module of claim 1 wherein the metallic cover of each of the plurality of transistor packages is bonded to the frame assembly with gold tin solder.

11. The module of claim 1 wherein the metallic base member of each of the plurality of transistor packages has a centrally disposed recess, the frame assembly is brazed to the base member surrounding the recess, and the substrate is disposed in the recess and spaced from the edges thereof for electrically isolating the first surface of the substrate from the base member.

12. The module of claim 1 wherein the base member of each of the plurality of transistor packages is composed of a tungsten copper mixture having a total thickness of approximately sixty mils, nickel plating overlaying the mixture having a thickness of approximately one tenth of a mil, and gold plating overlaying the nickel having a thickness of approximately fifteen hundredths of a mil.

13. The module of claim 1 wherein the substrate of each of the plurality of transistor packages has a ceramic core composed of one of the group consisting of beryllium oxide, aluminum nitride, and silicon carbide having a thickness in the range of approximately 7 to 40 mils, a film of one of the group consisting of chromium, titanium, molybdenum, tungsten, and titanium-tungsten, deposited directly on the ceramic core having a thickness in the range of approximately 20 to 80 nanometers bonding the copper layer to the first and second planar surfaces of the core, a layer of nickel approximately one tenth of a mil thick plated to the copper layer, and a layer of gold approximately fifteen hundredths of a mil thick plated to the nickel layer at least on the first surface of the substrate.

14. The module of claim 13 wherein the brazing material for brazing the base member, substrate, and frame assembly to one another is a layer approximately one mil thick of a mixture of silver and copper.

15. The module of claim 14 wherein the plurality of transistors of each of the plurality of transistor packages includes a silicon die, and the silicon die is soldered to the electrically isolated first surface of the corresponding substrate with a gold silicon solder.

16. a power transistor package, comprising:

a metallic base member;

a substrate having a ceramic core with first and second opposite planar surfaces, each of the planar surfaces having a layer of copper with a thickness in the range of approximately 0.5 to 7 mils bonded to each of the planar surfaces by a metallic film;

a metallic layer of nickel having a thickness substantially less than the copper layer plated on the copper layer, at least a portion of the first planar surface being electrically isolated from the base member for supporting a plurality of power transistors, the copper layer having the characteristics and thickness to spread heat from the plurality of power microwave transistors mounted on the electrically isolated planar surface, the second planar surface being brazed to the metallic base member;

a frame assembly brazed to one of either the metallic layer on the substrate or metallic base member surrounding and spaced from the electrically isolated planar surface of the substrate for connecting electrically at least two terminals exterior the respective package, the two terminals being electrically isolated from the substrate and the base member and from each other;

a plurality of power transistors mounted to the electrically isolated planar surface of the substrate; and a metallic cover bonded to the frame assembly for hermetically sealing the plurality of transistors within the package.

17. The package of claim 16 wherein the metallic base member has opposite planar surfaces, the frame assembly is brazed to the first surface of the substrate surrounding and spaced from the electrically isolated portion of the first surface.

18. The package of claim 16 wherein the brazed base member and substrate is gold plated.

19. The package of claim 16 wherein the ceramic core is composed of one of the group consisting of beryllium oxide, aluminum nitride and silicon carbide.

20. The package of claim 16 wherein the bonding material for the copper layer is a film approximately 20 to 80 nanometers thick composed of one of the group consisting of chromium, titanium, molybdenum, tungsten, and titanium-tungsten.

21. The package of claim 16 wherein the brazing material for brazing the base member, substrate, and frame assembly to one another is a mixture of silver and copper.

22. The package of claim 16 wherein the plurality of transistors include a silicon die, and the silicon die is soldered to the electrically isolated first surface of the substrate with a gold silicon solder.

23. The package of claim 16 wherein the metallic cover is bonded to the frame assembly with gold tin solder.

24. The package of claim 16 wherein the metallic base member has a centrally disposed recess, the frame assembly is brazed to the base member surrounding the recess, and the substrate is disposed in the recess and spaced from the edges thereof for electrically isolating the first surface of the substrate from the base member.

25. The package of claim 16 wherein the substrate has a ceramic core composed of one of the group consisting of beryllium oxide, aluminum nitride, and silicon carbide having a thickness in the range of approximately 7 to 40 mils, a film of one of the group consisting of chromium, titanium, molybdenum, tungsten, and titanium-tungsten, deposited directly on the ceramic core having a thickness in the range of approximately 20 to 80 nanometers bonding the copper layer to the core, a layer of nickel plated to the copper layer, and a layer of gold plated to the nickel layer on at least the first surface of the substrate.

26. The package of claim 25 wherein the brazing material for brazing the base member, substrate, and frame assembly to one another is a preform of a mixture of silver and copper.

27. The package of claim 26 wherein the plurality of transistors of a package includes a silicon die, and the silicon die is soldered to the electrically isolated first surface of the substrate with a gold silicon solder.

28. The package of claim 27 wherein the metallic cover is bonded to the frame assembly with gold tin solder.

29. A power microwave generating transistor module, comprising a thermally conductive metallic plate for supporting a plurality of electronic components;

a plurality of spaced inductive, capacitive, and resistive components mounted on the metallic plate;

a plurality of power microwave transistor packages spaced from the inductive, capacitive, and resistive components, and from each other mounted on the metallic plate, each of the packages including;

a metallic base member fixedly attached to and in physical engagement with the metallic plate for conducting heat from the base member to the metallic plate, a substrate having a ceramic core with first and second opposite planar surfaces, each of the planar surfaces having a layer of copper with a thickness in the range of approximately 0.5 to 7 mils bonded to the ceramic core by a metallic film, a layer of nickel having a thickness substantially less than the copper layer plated on the copper layer, at least a portion of first planar surface being electrically isolated from the metallic base member for supporting a plurality of power microwave transistors, the copper layer having the characteristics and thickness to spread heat from a plurality of power microwave transistors mounted on the first electrically isolated planar surface, the nickel layer of the second planar surface being brazed to the metallic base member; and a frame assembly brazed to one of either of the layer of nickel or the metallic base member surrounding and spaced from the electrically isolated planar surface portion of the substrate for connecting electrically at least two terminals exterior the respective transistor package, the two terminals being electrically isolated from the substrate and the base member and from each other.

30. A power transistor package, comprising:

a metallic base member;

a substrate having a ceramic core with first and second opposite planar surfaces, each of the planar surfaces having a layer of copper with a thickness in the range of approximately 0.5 to 7 mils bonded to each of the planar surfaces by a metallic film;

a layer of nickel having a thickness substantially less than the copper layer plated on the copper layer, at least a portion of the first planar surface being electrically isolated from the base member for supporting a plurality of power transistors, the copper layer having the characteristics and thickness to spread heat from power microwave transistors mounted on the electrically isolated planar surface, the second planar surface being brazed to the metallic base member; and a frame assembly brazed to a metallic surface surrounding and spaced from the electrically isolated planar surface of the substrate for connecting electrically at least two terminals exterior the respective package, the two terminals being electrically isolated from the substrate and the base member and from each other.

31. A package for a power transistor, comprising:

a ceramic substrate having a first surface for supporting at least one power transistor thereon, and a second surface opposite the first surface, at least the first surface of the first and second opposite surfaces being metallized;

at least the first metallized surface including a layer of copper having a thickness in the range of approximately 0.5 to 7 mils, for laterally spreading heat generated by a mounted power transistor;

a thin metallic film bonding the copper layer to the respective surface of the substrate, the thin film being of the type having a low thermal resistance for conducting the heat spread by the copper layer into the ceramic substrate through the first surface of the substrate, a layer of nickel having a thickness substantially less than the copper layer plated on the copper layer; and metal in contact with the second surface of the substrate for dissipating heat exiting the substrate;

the ceramic substrate electrically isolating the first metallized surface of the substrate from the metal in contact with the second surface of the substrate.

32. The package of claim 31 wherein the ceramic substrate has a thickness of approximately 7 to 40 mils.

33. The package of claim 31 wherein the thin metallic film is a film approximately 20 to 80 nanometers thick composed of one of the group consisting of chromium, titanium, molybdenum, tungsten, and titanium-tungsten.

34. The package of claim 31 wherein the ceramic substrate is composed of one of the group consisting of aluminum nitrate, silicon carbide, and beryllium oxide.

35. The package of claim 31 further comprising at least one power transistor mounted to and overlaying the metallized electrically isolated first surface of the substrate.

36. The package of claim 35 further comprising, means covering the first metallized surface of the substrate for enclosing the at least one power transistor.

37. The package of claim 36 wherein the means for enclosing the at least one power transistor includes a frame surrounding the electrically isolated first surface of the substrate for supporting a cover.

38. The package of claim 37 wherein the means for enclosing the at least one power transistor further includes a cover attached to the frame.

39. A power generating transistor module, comprising:

a plurality of metallized ceramic substrate portions, each having a first planar surface and a second planar surface opposite the first planar surface;

a plurality of spaced power transistors mounted on the metallized first surface of each metallized portion;

at least each metallized first surface portion including a layer of copper having a thickness in the range of approximately 0.5 to 7 mils for spreading heat generated by the plurality of transistors; a thin metallic film bonding the layer of copper to the respective planar surface of the substrate; the metallic film being of the type having a low thermal resistance for conducting heat from the copper layer and entering the substrate through the first surface;

a metal base member mounted opposing the second surface of each of the plurality of metallized substrate portions for conducting heat from said substrate;

the metallic base member being electrically isolated from the plurality of metallized first planar surfaces; and means interconnecting electrically the plurality of spaced power transistors for producing an output signal of a predetermined wattage.

40. The module of claim 39 further comprising means covering the plurality of metallized substrate portions for enclosing the plurality of spaced transistors.

41. The module of claim 40 wherein the means for enclosing the power transistors includes;

a frame attached to the base member surrounding and spaced from the first planar surface metallized substrate portions, the frame including means for connecting electrically at least two terminals of the plurality of transistors, the two terminals being electrically isolated from the metallized substrate portions and the base member and from each other; and a cover attached to the frame.

42. The module of claim 39 wherein each metallized substrate portion has a ceramic core with a thickness of approximately 7 to 40 mils.

43. The module of claim 39 wherein the ceramic of the metallized substrate portions is composed of one of the group consisting of aluminum nitrate, silicon carbide, and beryllium oxide.

44. The module of claim 39 wherein the thin metallic film is a film approximately 20 to 80 nanometers thick composed of one of the group consisting of chromium, titanium, molybdenum, tungsten, and titanium-tungsten.

* * * * *